United States Patent [19]

Powell et al.

[11] Patent Number: 5,012,471
[45] Date of Patent: Apr. 30, 1991

[54] VALUE-STRENGTH BASED TEST PATTERN GENERATOR AND PROCESS

[75] Inventors: Theo J. Powell, Dallas; John I. Hickman, Cooper; Jeri J. Crowley, Garland, all of Tex.

[73] Assignee: Texas Instruments Incorporated, Dallas, Tex.

[21] Appl. No.: 252,289

[22] Filed: Sep. 30, 1988

[51] Int. Cl.⁵ .............................................. G06F 11/10
[52] U.S. Cl. ........................................ 371/27; 371/23
[58] Field of Search ................... 371/27, 28, 23, 21.4, 371/22.5, 22.1, 15.1; 324/73 R, 73 AT, 73.1

[56] References Cited

U.S. PATENT DOCUMENTS

| 3,916,306 | 10/1975 | Patti | 371/28 |
| 4,204,633 | 5/1980 | Goel | 371/23 X |
| 4,696,006 | 9/1987 | Kawai | 371/27 |
| 4,716,564 | 12/1987 | Hung | 371/27 |

OTHER PUBLICATIONS

C. Salzmann, "Automatic Test Sequence Generation", IEEE Conference, Arlington, Tex., 11/1976, pp. 112-116.
P. Goel, "Dynamic Subsumation of Test Patterns for LSSD Systems", IBM TDB, vol. 21, No. 7, 12/1978, pp. 2782-2784.
P. Goel, "RAPS Test Pattern Generator", IBM TDB, vol. 21, No. 7, 12/1978, pp. 2787-2791.
C. Cha et al., "9-V Algorithm for Test Pattern Generation . . . ", IEEE Trans. on Comp., vol. C-27, No. 3, 3/1978, pp. 193-200.

Primary Examiner—Jerry Smith
Assistant Examiner—Robert W. Beausoliel
Attorney, Agent, or Firm—Melvin Sharp; James T. Comfort; B. Peter Barndt

[57] ABSTRACT

An automatic test pattern generator and process assigns value-strength number to selected nodes representing the electrical characteristic strength of integrated circuits including field effect transistors and the logic state values at those nodes. These value-strength numbers become sensitized to the inputs of the selected node and become propagated to outputs of the selected node for establishing patterns for test signals. The test signals later become used in chip testers for determining good and bad integrated circuit chips. The value-strength numbers also become used in dynamic testing of the integrated circuit nodes by using clock signals of the integrated circuit to establish a transition at a start node of a test path. Within a known clock period later, the transition should become captured at an end node of the test path.

4 Claims, 6 Drawing Sheets

VALUE-STRENGTH BASED TEST PATTERN GENERATOR AND PROCESS

BACKGROUND OF THE INVENTION

This invention relates generally to automatic test pattern generators used to develop test patterns for integrated circuits and particularly relates to automatic test pattern generators developing test patterns for integrated circuits using field effect transistors.

Before integrated circuits are delivered to customers, they are tested to insure that they operate correctly. This testing is essential to the quality of the final project; generating the patterns of test signals for conducting the testing, however, remains a tedious and unrewarding task.

Techniques have been developed for automating the generation of test signal patterns for each integrated circuit designed. Automating this generation relieves the engineer from manually determining the patterns of logical ones and zeros to be applied to the input pins of the integrated circuit and to be read from the output pins of the integrated circuit in testing each node or element of the integrated circuit. Customers demand products that have been tested to as close to one hundred percent of the circuit nodes as possible and customers also want to know if a node is untestable. These automation techniques have been joined together into programs known as the D algorithm, Podem and FAN. See Kirkland, Tom and Mercer, M. Ray, "Algorithms For Automatic Test Pattern Generation," IEEE Design and Test of Computers, June 1988, pages 43-54.

These know programs generate patterns of test signals, also known as vectors, automatically by selecting a node between gates or transistors in the integrated circuit. The program then assigns a hypothetical stuck-at fault of a logical one or zero to that node. The logical state at the node then becomes sensitized back to the primary input or input pins of the integrated circuit to determine if there exists a set of input logic signals to cause the desired stuck-at fault logical state at the selected node. The logical state at the selected node also becomes propagated forward to the outputs to determine whether a set of logical states at the outputs reflect the stuck-at fault state of the internal node. If a test of the selected node logical state exists, the program stores that set of logical states to be applied to the inputs and to be read from the outputs and indicates the node to be testable.

In the case of the program being unable to find a set of logical input and output states that reflect the selected logical state at the node, the program indicates to the user that the node is untestable. Often, however, the program unsuccessfully seeks to locate a pattern of input and output signals from all the available binary combinations or search space to test the selected node and, after a certain time, the program stops without giving the user information on the reason for failing to determine a test signal pattern.

One problem with these previous programs is their inadequacy and inability to test integrated circuits using field effect transistors. This results because these programs recognize only a logical one state or a logical zero state and do not recognize any other value-strength of the network forming the node that can exist between field effect transistors. These different value-strength numbers for networks using field effect transistors result from the different sizes of the field effect transistors, and their capacitive and resistive characteristics. For example, a stuck-at fault of a logical one state at a selected node comprising field effect transistors can have several different value-strength numbers. Also, a stuck-at fault might change the value-strength of that node.

Another problem with the previous programs was their inability to generate test patterns for bidirectional gates in which a stuck-at fault can occur at either side of the gate at different times depending upon whether that side of the gate is the load or the source. Another problem with the prior program was their inability to generate dynamic test pattern signals that deal with clock phases and sequential logic. These dynamic test patterns verify that the logic functions operate as expected within time interval specified by clock frequencies.

SUMMARY OF THE INVENTION

In accordance with the invention, an automatic test pattern generator and process define a logical value-electrical strength of a selected node to be a certain discrete number. This number results from the binary logical value of one or zero applied to the selected node and upon the electrical characteristics of the field effect transistors connected to the selected node. The selected node can be the output pin or input of a gate internal of the integrated circuit or it can be a collection of gate-pins forming a network.

The generator in process then assigns a value-strength number representing a desired stuck-at fault at the selected node and attempts to sensitize the assigned value-strength number of the node to a pattern of input signals to be applied to the primary input of the integrated circuits. The generator and process of the invention likewise attempt to propagate the same assigned value-strength number representing a desired stuck-at fault to a pattern of output signals to be observed or read from the primary outputs of the integrated circuit. If successful, the generator and process of the invention stores the successful sensitize and propagation as a pattern of test signals, indicates a testable node to the user and proceeds to repeat the process at the next selected node. The attempts to sensitize and propagate occur through the value-strength number model of the integrated circuits to the inputs and outputs and not through a logical model or an electrical model of the circuit. The value strength numbers can be used to represent every node of the integrated circuit from the selected node to the inputs and outputs. The automatic test pattern generator and process of the invention thus recognize the different value-strength number of circuit nodes of the integrated circuit under test and uses those value-strength numbers to determine testablity or untestablity of a node. The automatic test pattern generator and process of the invention recognize that the value-strength numbers of a node are defined by the logical state occurring at the node and by the electrical characteristics of the field effect transistors at the selected nodes. This goes beyond treating the circuit nodes in a pure binary manner to comprehend the varying electrical parameter of field effect transistors actually used in present integrated circuits while avoiding the complexities of electrically modeling the electrical characteristics of those field effect transistors.

The automatic test pattern generator and process of the invention produce patterns or vectors of test signals attempted to be applied to the primary inputs and observed or read from the primary outputs of integrated circuits or chips before or after they are placed in packages. Typically a chip tester performs the actual application of and reading of the logic signals to the integrated circuits or chips. The invention relates substantially to producing the patterns of test signals or vectors that are later applied and read from the chip under test.

In particular, the generator and process of the invention work to form a set of nodes of the integrated circuit that later will be tested. Knowing all of the logical circuit interconnections between the nodes and the primary inputs and outputs and the value-strength numbers of the nodes, the generator and process of the invention attempt to determine and to locate a pattern or logical signals or vectors that reflect an assigned stuck-at fault for the selected node. If successful, the generator and process indicate that the assigned value-strength number representing a desired stuck-at fault at the selected node can be tested from the primary inputs and outputs. This pattern of test signals or vectors then is stored for later use by the chip tester.

If unsuccessful after a user selectable period, the generator and process of the invention cease attempting to locate a pattern of test signals that reflect the assigned value-strength number at the selected node and provide information to the operator on the barrier or barriers encountered in unsuccessfully attempting to generate the test pattern signals. The generator and process then select another node of the integrated circuit, assign its value-strength number to represent a desired stuck-at fault at the selected node and repeat the preceding steps.

In addition, the generator and process of the invention recognize that the drains and sources of bidirectional gates or field effect transistors present special cases. The value-strength number representing a desired stuck-at fault in one direction can differ from the value-strength number representing a stuck-at fault in the opposite direction. Also in accordance with the invention, an automatic test pattern generator and process sensitize two or more test patterns of signals or vectors to test sequential or a test path by forcing a transition in a logical state at a start node of the test path. This generation of patterns for dynamic testing require no additional logic gates or registers in the integrated circuit to force or cause the desired transition and combines clock inputs with the inputs that receive the test patterns.

On a chip tester, applying the input patterns produces a logical state transition at a start node of the test path; the transition between logical states passes through the test path to the end node and becomes captured at an end node. If the transition is captured at the end node within a certain clock period, the test has been successful; otherwise the test is unsuccessful.

The test pattern generator and process of the invention use the value-strength number representing the desired logical states to produce the pattern of test signals input to the circuit and observed from the outputs.

DESCRIPTION OF THE PREFERRED EMBODIMENTS

Figure 1:
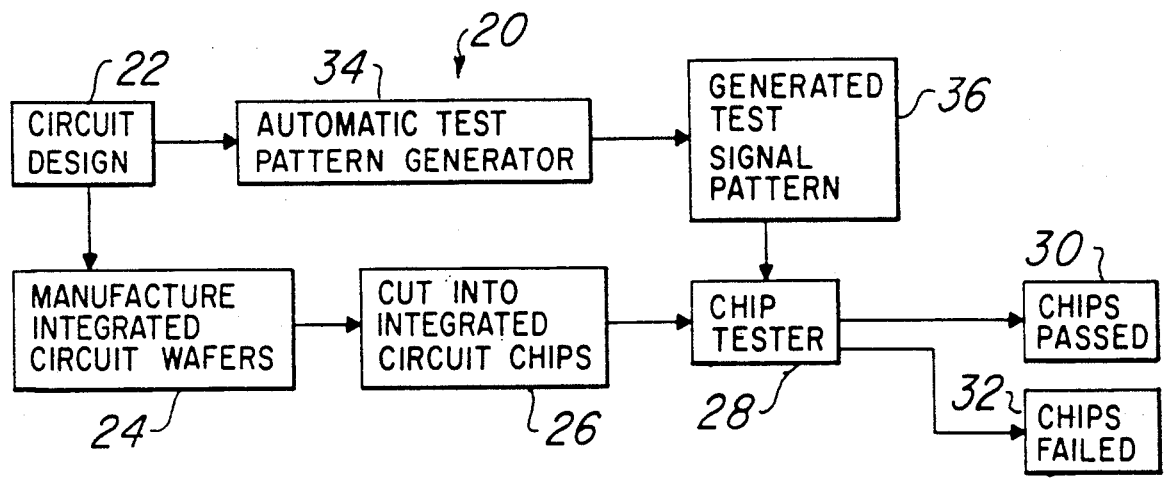
FIG. 1 is a schematic block diagram of the manufacturing steps involved in making integrated circuits chips.

In FIG. 1, a chart 20 of the process of designing, manufacturing and testing integrated circuit chips includes a circuit design 22, a manufacturer of integrated circuit wafers 24, a cutting of the integrated circuits into chips 26, and a testing 28. The chips 30 that pass the chip tester proceed to be sold to customers while the chips 32 that fail testing are disposed of as desired.

The chart 20 further includes the automatic test pattern generation 34 and the generation of the test pattern signals 36 to the chip tester 28. Of this sequence of manufacturing steps the invention relates specifically to the automatic test pattern generator 34, which sometimes is explained in terms of the generated test signal patterns 36.

Figure 2:
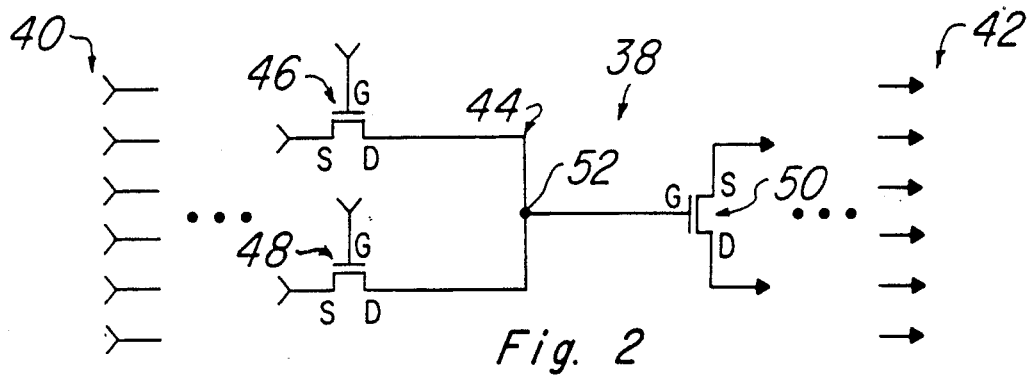
FIG. 2 is a circuit diagram of a field effect transistor network forming a node between primary inputs and outputs of an integrated circuit.

In FIG. 2, an integrated circuit 38 includes primary inputs 40, primary outputs 42, and plural internal circuit nodes including one depicted internal circuit node 44. The network of circuit elements connected or influenced by circuit node 44 includes field effect transistor 46, field effect transistor 48 and field effect transistor 50. This application uses the word node genericly to describe the pin of an internal gate or field effect transistor such as the drain D of transistor 46 and also uses the word node to define the collection of gate pins and thru net effect such as the effect of the drain D of transistors 46 and 48 and the gate G of transistor 50 at interconnection 52. The invention includes defining the relative strengths of a electrical characteristics of a node at a particular binary logic value with one of a set of discrete value-strength numbers. These value-strength numbers and their electrical strength representation are charted as follows:

0— unassigned (open)
1— voltage
2— driven
3— natural
4— resistive (depletion)
5— big floating
6— little floating
99— no path (source disabled, transistor off)

The value-strength for logical values one and zero indifferent technologies is charted as follows:

| Technology | Strength | 1 | 0 |
|---|---|---|---|
| TTL | | 3 | 2 |
| I2L | | 3 | 2 |
| CMOS PMOS | | 2 | 2 |
| Natural | | 3 | 3 |
| Depletion | | 4 | 4 |
| N MOS Boolean Gates | | 4 | 2 |
| N MOS Field Effect Transistors | | 2 | 2 |

The selection of these numbers as a particular example is arbtrary; the important aspects being the recognition of the value-strength to model the field effect transistor and their relative positions.

By the use of these value-strength numbers the invention defines over prior test pattern generators that only set the values of the nodes and ignores the strengths of the field effect transistors. The use of the value-strength numbers accurately models the field effect transistors in the integrated circuits to obtain the desired near one hundred percent testing of present integrated circuits. While the use of these value-strength numbers conceivable presents more variations than a test generator and process using only binary logical states, the present assignment of value-strength numbers accurately models the field effect transistor logic that the known test generators operating only in binary logic one and zero could not model. This results because, for example, in TTL logic, the logical zero always dominated in the wired junction figuration because it was stronger. With field effect transistors, a logical one value can dominate in a wired junction situation and any strength pair can exist. Further, the charge on the gate of a field effect transistor can be overdriven by a logical one value from the power source.

In a implementation, the test pattern generator and process of the invention substantially start with the value-strength numbers representing the desired stuck-at faults at selected nodes and then uses the D algorithm to generate the desired patterns of test signals. The invention however is not limited to the D algorithm and the value-strength numbering system can find utility with other algorithms to generate patterns of test signals. Presently, certain designers now use building blocks of transistor cells with well defined electrical strengths from which the value-strength assignments of any node can be determined.

While some penalty and complexity of the test pattern generator occurs, the test pattern generator and process often resolve an available value-strength number once they sensitize or propagate to a certain boolean gate with a fixed value-strength number.

Figure 4:
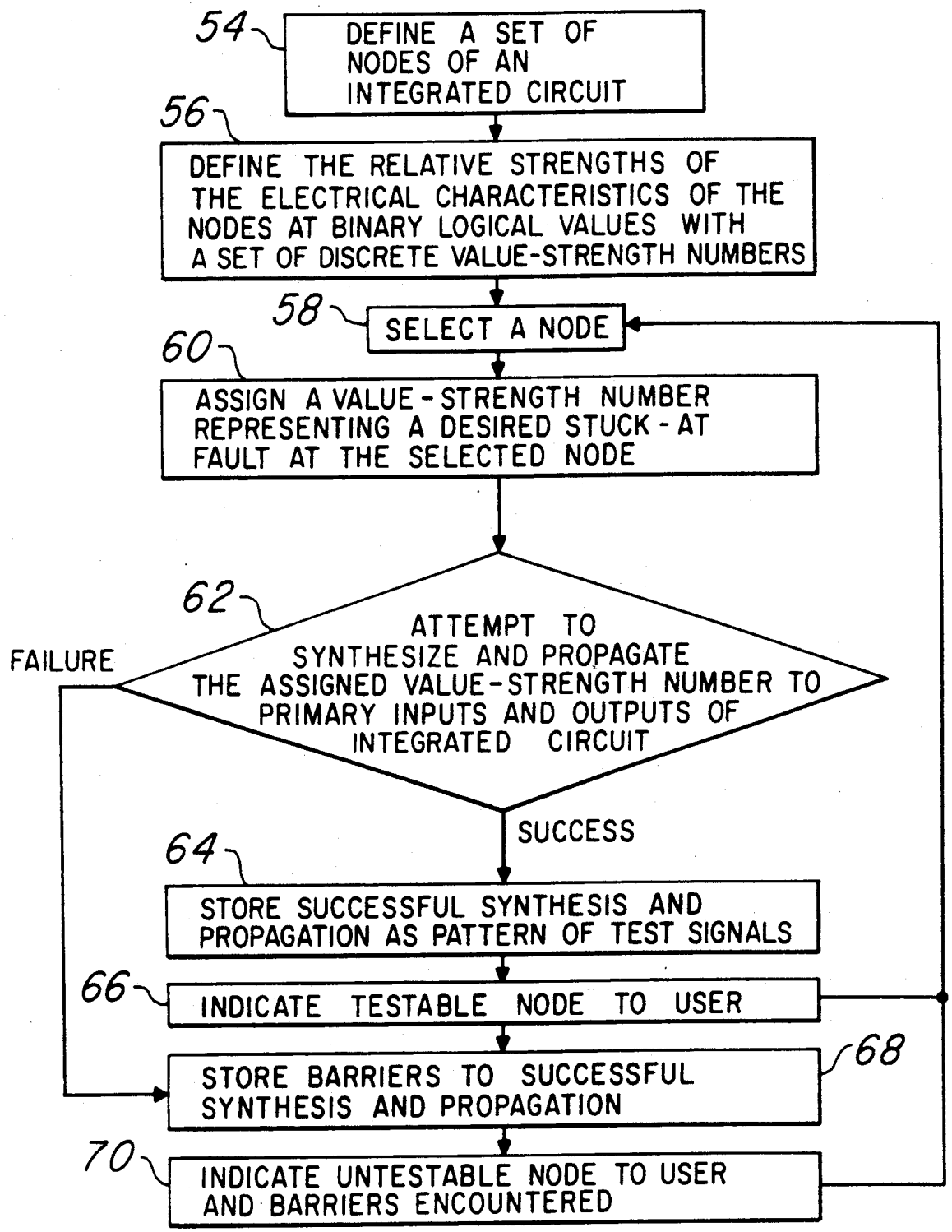
FIG. 4 is a flow chart of steps using the assigned value-strength numbers or represent desired stuck-at faults on selected nodes.

Referring to FIG. 4 and referencing FIG. 2, the first step 54 of the process of generating a pattern of test signals defines a set of nodes of an integrated circuit. Step 56 then defines the relative strengths of the electrical characteristics of the nodes at binary logical values with a set of discrete value-strength numbers. The next step 58 selects a nodes of the set of node of the integrated circuit and step 60 assigns a value-strength number to represent a desired stuck-at fault at the selected node.

In FIG. 2, for example, a selected node of the drain D of transistor 46 is assigned a value-strength number representing a stuck-at fault at that node. That node may differ from the value-strength number representing a desired stuck-at fault at node 52. By assigning the value-strength number to the drain D of transistor 46, this implies certain value-strength numbers at other nodes such as the gate of transistor 50 and the drain D of transistor 48. It also implies certain circuit conditions such as the gate G of transistor 48 being turned off and the gate G of transistor 46 being turned on, for example.

Again in FIG. 4, the next step 62 attempts to sensitize and propagate the assigned value-strength number from the selected node to the primary inputs and outputs of the integrated circuit. Propagation also can induce setting input signals at pins 40 to obtain desired signals at pins 42. For example, transistor 48 must be operated to propagate from the selected node D of transistor 46 to the pins 42. Sensitizing occurs from the selected node such as the drain D transistor 46 to the inputs leads of 40. Propagation occurs from the selected node of drain D of transistor 46 to the output leads 42. Sensitizing and propagating also can occurs at intermediate points other than the input pins 40 and output pins 42 at which the desired signals can be forced and be observed, respectively. If successful in these attempts, the next step 64 stores the successful sensitize and propagation as a pattern of test signals. The next step 66 indicates a testable node to the user and the process returns to step 58.

If unsuccessful or the generator fails to produce a test, the next step 68 stores the barriers to the successful sensitize and propagation and then step 70 indicates the untestable node to the user and the barriers encountered. This last step 70 is vital to a user for manually determining the possibility of a testable node after the generator and process of the invention time out. After step 70, the process again returns to step 58 of selecting another node and proceeds through the described steps.

Figure 3:
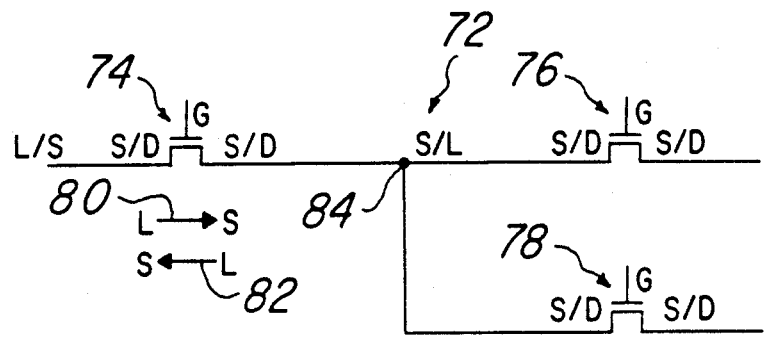
FIG. 3 is a circuit diagram of a network forming a node on one side of a bidirectional gate.

In FIG. 3, network 72 comprises field effect transistors 74, 76 and 78. Field effect transistor 74 is bidirectional with the load passing to the sink from left to right and the load passing to the sink from right to left as indicated by arrows 80 and 82 respectively. The inputs and outputs electrodes of the transistors 74, 76 and 78 are indicated to be either sources or drains by the letter S/D in this configuration, the value-strength numbers representing the electrical characteristics and desired binary logical states on either side of bidirectional transistor 74 can be assigned different value-strength numbers depending upon the direction of the load through the transistor 74. In particular, it must be noted that the value-strength representing a drain node in a bidirectional transistor can be the sum of all of the sources feeding the network minus the source of that transistor.

While the invention uses the value-strength numbers as a tool to test selected nodes and combinational or combinatorial logic, the invention also uses this value-strength number tool in dynamic testing of sequential logic and combinatorial logic. It should be noted that dynamic testing referred to in this application describes what is known in the art as AC test generation even though the term AC is a misnomer for alternating current because no alternating current is used in the test generation. In this application, therefore, the term dynamic testing refers to the causation and capture of transitions between logical states within a certain clock period. This tests whether a transition from one to another logical state can occur at an observable point such as an output pin or some other node internal of the integrated circuit. This dynamic test thus becomes a test over a path through the combinational logic.

Figure 8:
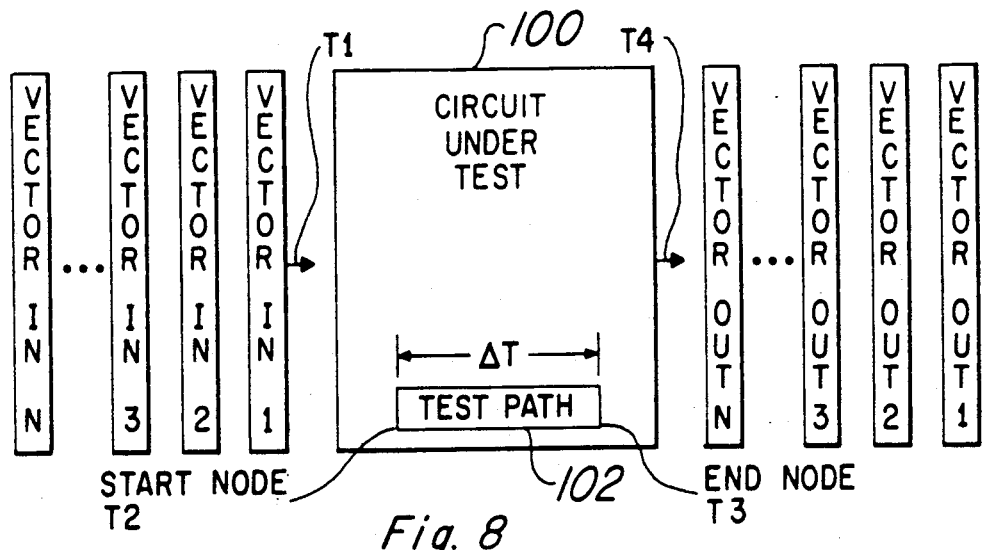
FIG. 8 is a schematic block diagram depicting the application of vectors to the inputs to a circuit under test and the vectors read from the outputs and dynamic testing of a test path.
Figure 11:
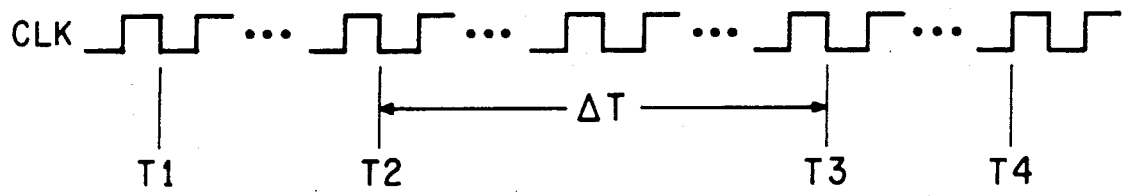
FIG. 11 is a timing diagram indicating the times T1, T2, T3, T4 and $\Delta$T indicated in FIG. 8.

Referring to FIG. 8, a circuit under test 100 includes a test path 102 having a start node and an N node. Vectors in 1, 2, 3 ... end represent patterns of test signals applied to the circuit under test at time T1. Vectors out 1, 2, 3 ... N represent test pattern signals observed from the circuit under test at time T4. The vectors in a set desired logical state at the start node and at time T2 cause a transition of the logical state at the start node. This transition in a properly operating circuit which is under test appears at the end node of the test path at time T3 with the difference between times T2 and T3 beginning a ΔT. This timing is represented in FIG. 11.

Figure 9:
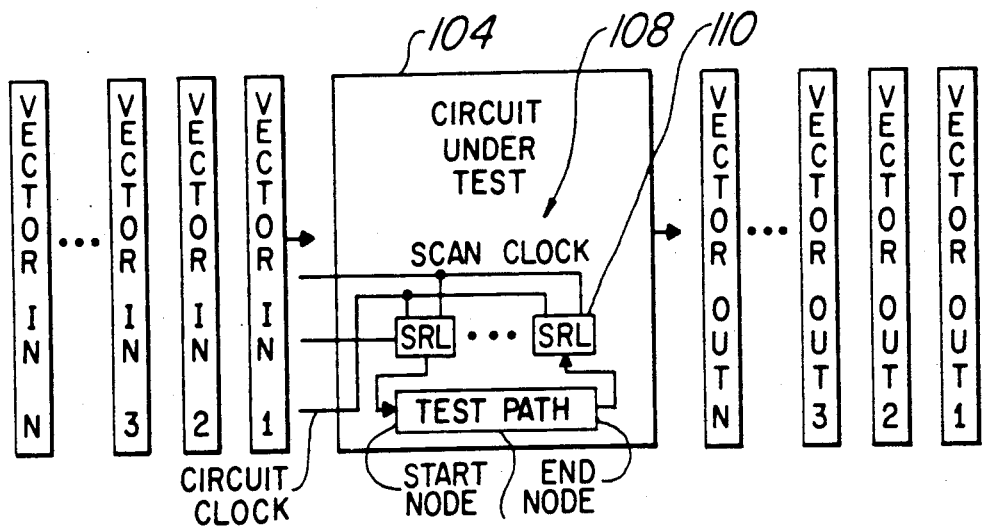
FIG. 9 is a schematic block diagram similar to that in FIG. 8 further depicting serial register latches.

In FIG. 9, the circuit under test 104 includes a test path 106 substantially similar to that depicted to that in FIG. 8. In addition, a scan path 108 comprises a pair of SRL serial register latches 110. The circuit clock and scan clock receive the patterns of test signals from the vectors in 1, 2, 3 ... N and apply them to the start node of the test path 106 while capturing the effected transition at the end node of test path 106 in another SRL. A scan path with serial register latches is disclosed in U.S. Pat. No. 4,698,588 assigned to Texas Instruments Incorporated. The disclosure of that scan path and associated clocks is incorporated herein by reference.

Figure 10:
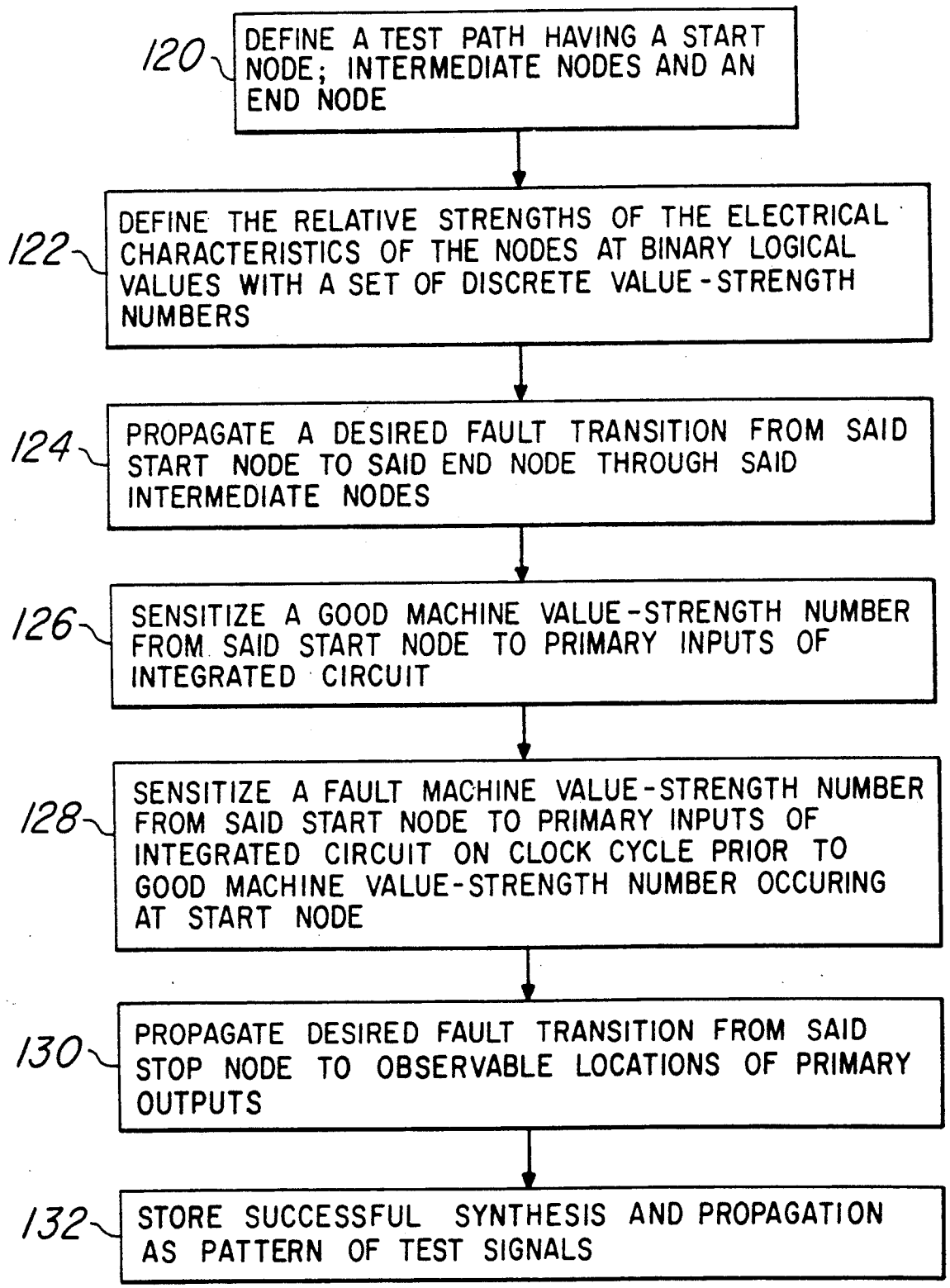
FIG. 10 is a flow chart of steps for generating a set of test patterns for dynamic testing of an integrated circuit.

In FIG. 10, the sequence of steps for generating patterns of test signals for dynamic testing starts with step 120 to define a test path having a start node, intermediate nodes and an end node. The next step 122 defines the relative strengths of the electrical characteristics of the nodes at a binary logical values with a set of discrete value-strength numbers. This is similar to a corresponding step of the simple combinatorial logic.

In step 124, the generator and process propagate a desired fault transition from the start node to the end node through the intermediate nodes. The next step 126 sensitizes a good machine value-strength number from a start node to the primary inputs of the integrated circuit. Step 128 then sensitizes a fault machine value-strength number from the start node to the primary inputs of the integrated circuit on a clock cycle prior to the good machine value-strength number occurring at the start node. These two steps 126 and 128 set the node to force the desired transition from the fault machine value-strength number to the good machine value-strength number at the desired clock cycle. The step 124 propagates the transition from the start node to the end node at which it can be captured and, if captured within a certain clock period during the testing of chips in the chip tester, a good circuit is indicated.

The next step 130 propagates the desired fault transition from the stop node to an observable location such as the primary outputs. The last step stores the successful sensitize and propagations as a pattern of test signals later to be applied by the chip tested.

Figure 5:
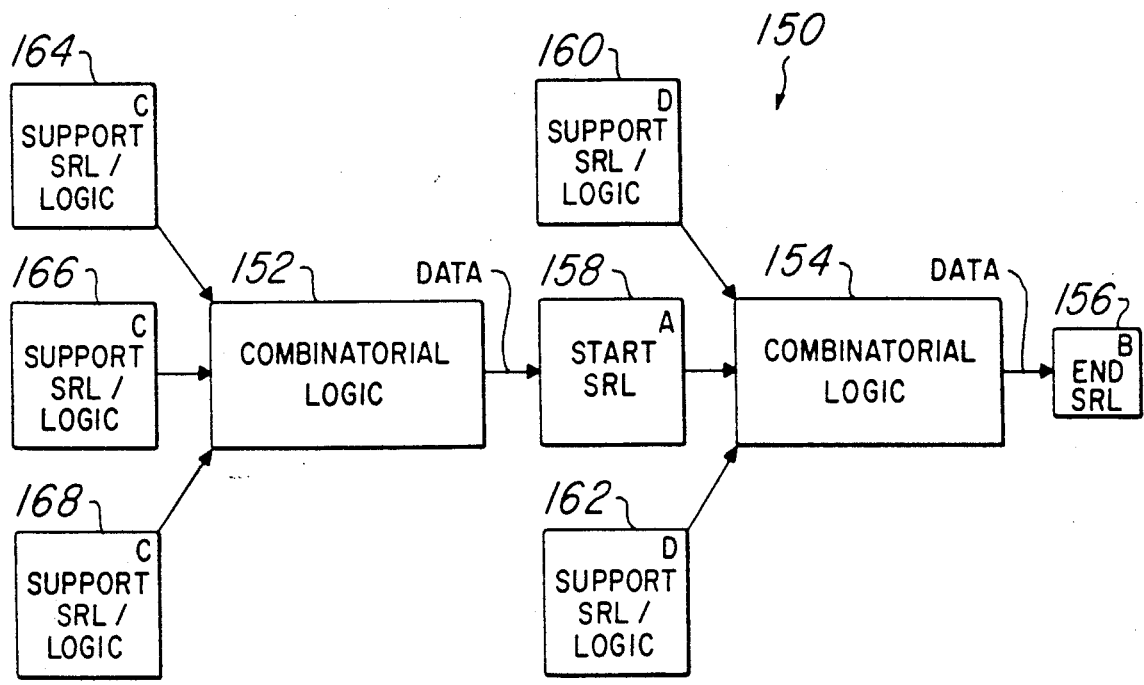
FIG. 5 is a schematic block diagram of an arrangement used in dynamic testing of combinatorial logic.

In FIG. 5, a circuit 150 comprises two grouping of combinatorial logic 152 and 154. In substance, the combinatorial logic 154 or combinatorial logic 152 and 154 can comprise the test path 102 or 106 of FIGS. 8 and 9 respectively. In this case, all of the circuitry feeding the combinatorial logic 154 acts to set an initial logic state for dynamic testing and on a substance clock cycle cause a transition to another logic state. This transition passes through the combinatorial logic 154 and is captured at end SRL 156. Start SRL 158 specifically causes the transition from one to the other logic state.

In this circuit 150, the transition start point is a memory point formed by start serial register latch 158. The transition is made going from a memory output state to a changed memory output state. The propagated path is generated going through the combinatorial logic 154 from start SRL 158 to end SRL 156. The sensitized path is produced by selecting the proper support SRL 160 and 162 state values.

The transition is generated by selected values in support SRLs 164, 166, 168 and combinatorial logic 152 to cause the transition and start SRL 158.

The SRLs 160, 162, 164, 166 and 168 can be part of a scan path identified in U.S. Pat. No. 4,698,588 or can be other support logic. Start SRL 158 and end SRL 156 can be part of the scan path identified in that pattern.

Figure 6:
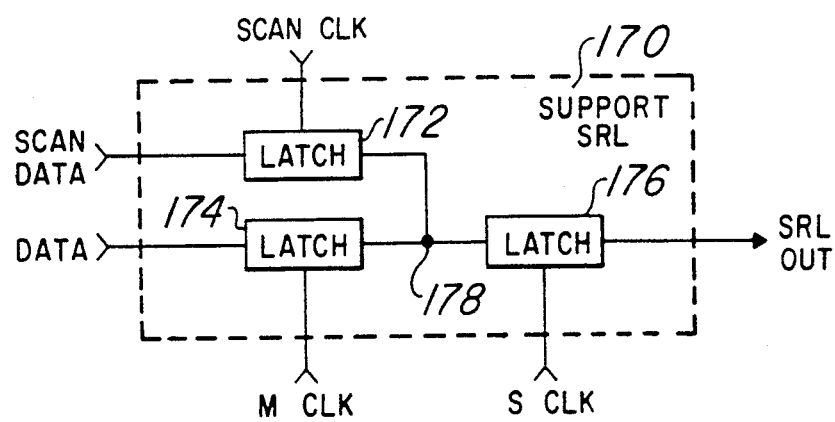
FIG. 6 is a block diagram of a support serial register latch used in FIG. 5.

In FIG. 6, a support SRL 170 comprises three latches 172, 174 and 176. Latch 172 receives a scan clock and scan data to produce its outputs at interconnection 178. Latch 174 receives a master clock and data to produce its output to interconnection 178; latch 176 received the information on interconnection 178 and a slave clock to produce the SRL out signal. This allows either scan data or regular data to be passed through the support SRL in response to the scan clock, the master clock and the slave clock to produce the desired output to the combinatorial logic 154.

Figure 7:
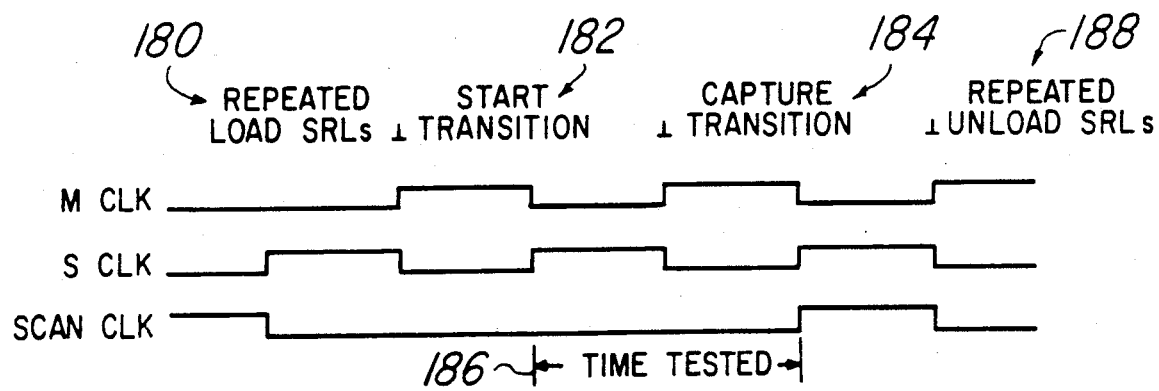
FIG. 7 is a timing diagram indicating the timing of the circuit arrangement of FIG. 5.

In FIG. 7, first period 180 indicates the repeated loading of the SRLs with the desired logical states. During period 182, the transition from one logical state to another appears at the input of the combinatorial logic in FIG. 5. In period 184, the output of the combinatorial logic 154 of FIG. 5 is captured as a transition if the circuit works properly. This time period of testing is indicated by period 186, the period there following and period 188 repeated clock pulses appear to the SRLs to unload them such as is the case of moving the captured transition to an observable output lead.

FIG. 11 indicates that many clock cycles can occurs between times T1, T2, T3 and T4 to account for shift register delays between the indicated times to set up desired values at selected nodes and to propagate observed results to output pins.

Figure 12:
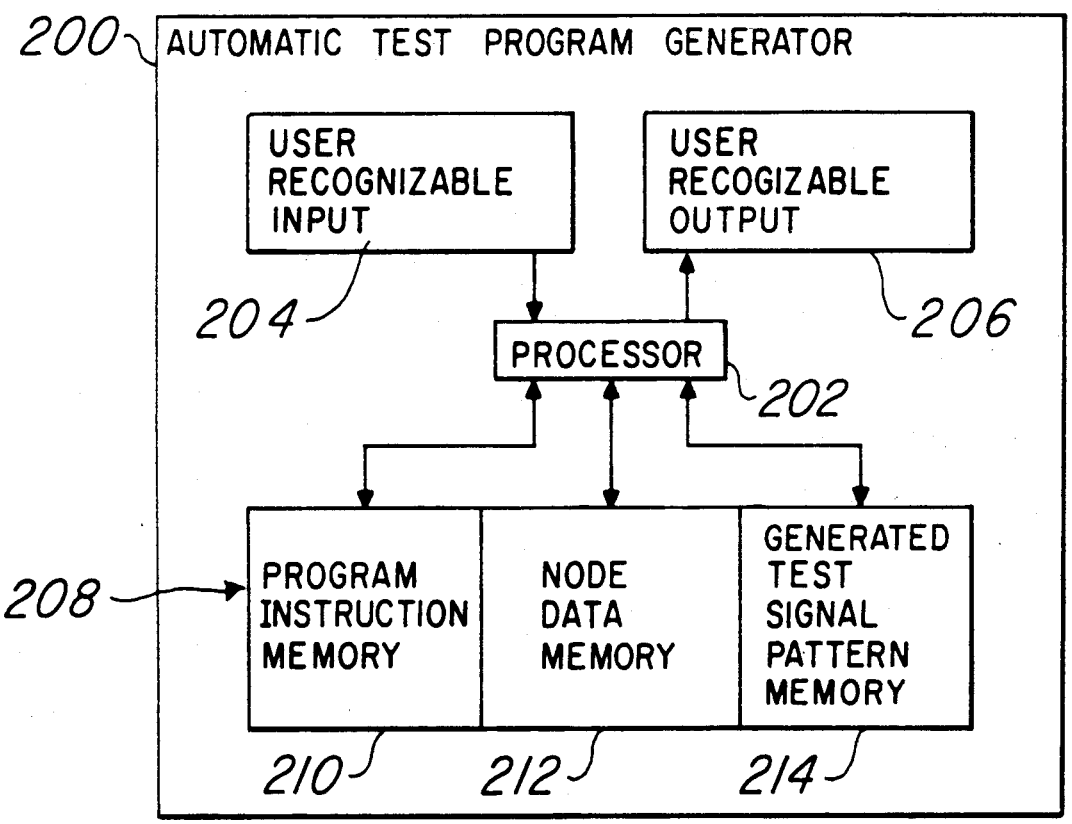
FIG. 12 is a schematic block diagram of an automatic test program generator used in conjunction with the invention.

In FIG. 12, the automatic test program generator 200 comprises a processor 202, a user recognizable input 204 and a user recognizable output 206. The generator also includes a memory 208 comprising a program instruction memory 210, a node data memory 212 and a generated test signals pattern memory 214.

The program instruction memeory contains the instructions operated through the processor to operate upon the node data memory in attempting to generate the pattern of test signals. When the test signal patterns have been successfully generated they become stored in the generated memory 214. The user recognizable input provides for loading the memory 208 with the program instructions and the node data. The user recognizable output 206 provides for indications of testable nodes and for moving the generated test signal patterns out of the automatic test program generator for later use in the chip tester.

Referring to the dynamic testing, the invention uses a template to limit the available choices for automatic test pattern generation. This template has the user define or fix one signal to a particular logic state. The test generator and process of the invention then attempts to develop the test pattern with the remaining signals. This can significantly increases the speed at which the test patterns become generated.

In a broad view, the invention concerns obtaining a better model of the integrated circuit containing field effect transistors beyond the binary logic models previously used in automatic test pattern generation and beyond the electrical models of such integrated circuits used in circuit design. The better model of the integrated circuit with field effect transistors results from properly setting the value-strength number to reflect desired binary logic values with the strengths of the electrical characteristics occurring at selected pins, gates and nodes in the integrated circuit.

Here follows and explanation of the software program called CAP (Catch a phault) for implementing the present invention.

Subroutine CAPEXEC

Data Structures value record pointer list

Algorithm Overview

CAPEXEC is the main driving routine for CAP.

CAPEXEC algorithm

1. <initialize> open files, do misc. housekeeping (read debug switches, get circuit technology type, specify maximum XA memory to get, etc.)
2. <build signal list> call subroutine SIGSCAN (subroutine traverses the circuit description and build a linked list of signals).
3. <initialize value record list headers> set up the array of value record pointers (indexed by signal number).
4. <process command file> call subroutine PARDRIVE (subroutine reads command file, processing each command as it is encountered).

Algorithm Function and Comments

CAPEXEC calls PARDRIVE which calls GENERATE, which is the test generating part of CAP.

Subroutine GENERATE

Data Structures fault list
implication stack
decision stack

Algorithm Overview

GENERATE implicates template information, then for every fault GENERATE implicates fault, processes next decision on decision stack, and then outputs fault status.

GENERATE algorithm

1. <initialization> call subroutine GENINIT (builds default value records, store I/O information on the signal lists, set decision number to 0.
2. <process phase information> call subroutine TEMPLATE (build a value record for each phase of each signal and push on implication stack).
3. <implicate> call subroutine IMPLICATE, if failure then return (implicate everything on the implication stack, escape from subroutine if either a hard or soft failure).
4. <get next fault> call subroutine GETFAULT (get a fault from list and build a value record for it, push a decision on stack).
5. <implicate fault> call subroutine IMPLICATE.
6. <process decisions> call subroutine DECIDE (process decisions on the decision stack).
7. <output pattern> output comment stating fault status, output pattern if generated.
8. <continue processing> if more faults remain then go to step 4 else halt.

Algorithm Function and Comments

This algorithm attempts to generate a test for each fault on the fault list.

Subroutine GETFAULT

Data Structures

VALUE RECORD:
 phase
 decision number
 signal number
FREE CHAIN: The free chain is used for memory management. As value records are discarded, they are linked together into a stack of unused (free) value records, thus memory is reused without fragmentation or the necessity of gargabe collection.
IMPLICATION STACK: each record on the stack contains the following:
 MCT or signal no.
 index to value rec
 flags:
  good machine
  fault machine
  decision
DECISION STACK: See the DECIDE algorithm for details of the decision stack mechanism. The decision stack record specifies the decision type associated with it.

Algorithm Overview

GETFAULT first removes all unneeded value records and initializes both the implication and decision stacks. It then gets the next fault to be processed from the fault list data structure. Value records are built for the good and fault machines for each phase along with an implication record which is pushed onto the implication stack. Fault selection is pushed on the decision stack as the first decision, phase selection is pushed on the decision stack as the second decision.

GETFAULT algorithm

1. <get next fault> get next fault from linked list.
2. <clean up value records> if not initial fault then walk through all of the value records putting all those that have a decision number >0, a nil backward pointer, or are for a fault machine on the free chain (only those records containing phase and strobe information will be saved).
3. <clean up stacks> initialize both the implication and decision stacks to 0 entries.
4. <delete alternate signal record> delete load signal segment alternate signal record if it exists (one extra alternate signal record is set up if the fault site is a signal output segment), restore the signal information in the associated MST.
5. <find next fault> continue down fault list until the next fault with correct status and run number is found.
5A <find AC FINISH start point> for COP to be called later. COP is called to direct path toward the AC Finish pts.
6. <set decision number> decision number:=1 (fault always starts at decision 1).
7. <copy good machine to fault machine> duplicate any existing value records for fault machine (values present for a signal will have been set by PHASE command).

8. <is fault on signal?> if pin number=0 then fault site:=signal number, go to 11 (if pin number is >0 then the fault is on a pin rather than on a signal).
9. <does signal have multiple loads?> if signal is not a block input or number of loads=1 signal number<=number of signals then fault site:=signal number, go to 11 (if the fault is on one of the loads of a multiple load signal then set up an alternate signal record).
10. <set up alternate signal record> record alternate signal in MST, record alternate signal in signal linked list, set fault site:=alternate signal.
11. <initialize phase number> set phase number:=1.
12. <create GM and FM value records> if alternate signal get copy of its parent signal (momsig) value record for GM else use fault site signal, get copy of fault site signal value record for FM (value records are for current phase number).
13. <set up value record values> GM, FM value records:=decision number 1, FM logic value:=stuck-at value, FM strength:=1-99.
14. <filter FM value record> get strengths for default technology and filter FM value record with them (filtering updates the strength range to reflect technology strength limits).
15. <update value record list> put GM and FM value records into list.
16. <push FM> push FM onto implication stack.
17. <increment phase number> if phase number<number of phases, then increment and go to step 12.
18. <push fault decision> put fault decision on decision stack.
19. <push phase selection decision> put phase selection decision on decision stack.

Algorithm Analysis

The purpose of GETFAULT is to get the next fault to be processed and prepare for test generation of that fault. A fault that resides on the load of a signal that has multiple load must have a signal record set up for it (alternate signal) since the fault cannot be applied to the signal and adequately model the fault specified. In order to prepare for the new fault, the decision stack and implication stack must be empty and all value records not associated with phase template and strobe information must be deleted.

What does GETFAULT cost in running time and memory? Step 1 takes O(1) time since a pointer is always kept to the last fault in the linked list. Step 2 can be expensive in that even though it runs in O(n) time where n is the number of existing value records. The number of value records can be quite high since value records could be created for each signal and segment, for each phase, for each decision. Because step 2 is only executed once per GETFAULT call, the cost of step 2 is not important in relation to other expensive parts in CAP. All other steps take constant time including those that deal with alternate signal records. Steps 12-17 are a loop which is executed once for every phase. The cost of GETFAULT then is O(n), where n is the number of existing value records. GETFAULT costs a constant amount of space in value records, implication records, decision records, and general book keeping.

Subroutine DECIDE

Data Structures

IMPLICATION STACK: The implication stack is a stack made up of the following records:
  MCT or signal no.
  index to value rec
  flags:
    path
    forward
    decision
    good machine
    fault machine
    old decision
    new decision
  pin number DECISION STACK: See the DECIDE algorithm for details of the decision stack mechanism. The decision stack is a stack made up of the following records:
  pin number
  path flag
  forward flag
  decision flag
  good machine flag
  fault machine flag
  new decision flag
  old decision flag
  decision type
  pointer to gate (0 if record is for signal)
  index to value record
  D_D_LINK: THREE_BYTES;
  D_D_DATA: THREE_BYTES;
  highest affecting decision number
  child number
  choices Algorithm Overview The DECIDE routine processes all decisions according to the decision type found in the decision record. If there has been no hard or soft failure, the the implication stack is processed. The following decision types are controlled by DECIDE:

1: Fault machine initialization. The phase in which a fault is to be started is selected. The selection process proceeds from phase 1 to the maximum number of phases. At each phase at attempt is made to set the good machine to a value opposite the fault machine and drive the GM value backwards (set up the controls to make the value happen). Then the path is pushed into the implication stack to be driven forward.

2: Fanout decision for path. Select a load to drive through.

3: Non-interfer value selection backward. This decision is used to support wired function backward (decision type 4).

4: Wired function backwards decision. This decision selected a driver to be driven backwards and the non-interfer segments to be driven backwards. Uses decision type 3 for the non-interfer segments.

5: Is used for non-interfer set ups to allow a path through a wired function. This is to decision type 7 as decision type 3 is to decision type 4 for the wired function backwards.

6: D-cube driver match list handler.

7: Manages the drive of the path through a wired function. It sets up the non-interfer segments and uses decision type 5 to process them. Then puts in decision type 11 to move forward through the set up junction.

8: Move forward through phases by floating the next phase. The the path (and this is for the path) can proceed from that point.

9: Move backward through phase by floating the current phase signal and driving the desired value in the preceding phase.

10: Break the path strength ranges into descrete components for passage through a wired junction. This is to allow decision type 7 to select the values for the non-interfer signals to be used by decision type 5.

11: This is used by decision type 7 to delay the passage of the path through a wired junction until after the non-interfer decisions (decision type 5) have set it up.

DECIDE algorithm

1. <initialize> set hard and soft failure flags to false.
2. <get next decision number> call subroutine DECSETUP (subroutine finds next decision number to process from decision array, if no more decisions follow in the decision array then one is popped off of the decision stack and put in the decision array, if the stack is empty then test generation is successful).
2. <stop if done> if no more decisions then halt.
3. <get next decision record> get next decision record from decision array.
4. <build an implication record> move pointer to gate, pin number, path, forward, decision, GM, GM, new decision, and old decision flags from decision record into implication record (the implication record will be passed to the various subroutines that process the decision numbers).
5. <get value record for decision> find value record for current decision record and put its index into implication record.
6. <reset failure flags> set hard and soft fail flags to false.
7. <process phase decision> if decision type=1 then call subroutine DECPHASE (subroutine processes a phase decision).
8. <process fanout decision> if decision type=2 then call subroutine FANOUT (subroutine handles the selection of a path on a signal fanout).
9. <process noninterfer backward decision> if decision type=3 then call subroutine DECNONIN (subroutine handles the selection of a noninterfering path backward on a wire junction).
10. <process wire function backward> if decision type=4 then call subroutine BKWF (subroutine handles the selection of a driving signal on a wire function).
11. <process gate decision> if decision type=6 then call subroutine CUBEPRO (subroutine handles selection of a pin on a gate).
12. <PROCESS GATE DECISION> IF DECISION TYPE=7 THEN CALL SUBROUTINE DECBTR (SUBROUTINE HANDLES SELECTION OF A BTR DIRECTION).
13. <CHOOSE CURRENT PHASE OR ADVANCE TO NEXT> IF DECISION type=8 then call subroutine DECFLTFW (controls time leap forward decisions).
14. <CHOOSE CURRENT PHASE OR BACK TO PREVIOUS> IF DECISION type=9 then call subroutine DECFLTBK (controls time leap backward decisions).
15. <PROCESS A STRENGTH RANGE DECISION> IF DECISION TYPE=10 then call subroutine DECRANGE (breaks strength range into descrete values in order to pass through a wire junction).
16. <DELAY FORWARD PROGRESS> IF DECISION TYPE=11 THEN CALL subroutine DECDELAY (delay the forward progress of the path through a wire junction until non-interfer decisions have been processed).
17. <IMPLICATE DECISION INFORMATION> IF NO FAILURE THEN CALL subroutine IMPLICAT (processes the implication stack).
18. <CONTINUE TO NEXT DECISION> GO TO STEP 2.

Algorithm Function and Comments

As the test generation process progresses, there are times when decisions must be made. For example, when driving backward through a gate, a decision must be made as to which input pin to travel backward on. Each time such a decision is encountered, it is documented in the form of a decision record and pushed onto a stack. In this manner, a tree of decisions is built and processed in a depth first manner. The structure of the decision tree is inherent in the stack and decision array structures.

The decision data structures consist of a stack used to hold pending decisions, and an array of decision records being processed. As decision points are encountered, they are pushed onto the decision stack. When it is time for a decision to be processed, first the current decision number is incremented (the current decision number indexes the decision array), if there is no next decision in the array, then one is popped off of the decision stack an placed in the array at that position. Decisions can be removed from the decision array an pushed back onto the decision stack. This will occur when there is a backup to a highest affecting decision number.

Subroutine DECPHASE

Data Structures

Decision record
Implication record

Algorithm Overview

The DECPHASE algorithm sets up good machine value records for forward and backward implication from the current fault site for the current phase being processed in the current decision.

DECPHASE algorithm

1. <get decision information> get phase number, signal number, pin number from current decision.
2. <decriment phase number> decriment phase number in current decision record. Decriment phase number until phase can start in the selected phase.
3. <check phase number> if phase number <=0 then set hard failure flag:=true, go to step 11 (note that phase number is now one more than phase number in current decision record).
4. <build a good machine value record> build good machine value record with open strength (1-99) for 0 and 1 values, decision number:=current decision number, control path flag:=true, logic value:=opposite of fault machine value, set fault machine path flag:=true.

5. \<filter GM value record\> filter range values of good machine according to technology type for current signal.
6. \<push GM onto implication stack\> set up implication record for GM and push onto implication stack if a value record does not already exist that either conflicts or is equivalent (not an event) to the GM value record.
7. \<implicate\> if implication record was pushed then call subroutine IMPLICAT (subroutine implicates next record on implication stack).
8. \<set failure flag\> IF IMPLICAT returned a soft failure and the phase number $<=1$ then set hard failure flag:=true, halt.
9. \<check flags\> if either hard or soft failure flags=-true then halt.
10. \<implicate GM forward path\> build implication record for GM path forward, push onto implication stack, call subroutine IMPLICAT.
11. \<check failure flag\> if soft failure and phase $<=1$ then set hard failure flag:=true.

Algorithm Function and Comments

The next phase is processed (starting from the highest phase number) and the phase number listed in the current decision record being processed is decremented. A failure from the first phase produces a hard failure for the decision.

Subroutine DECNONIN

Data Structures

Implication record
Decision record
Range value table (list)

Algorithm Overview

The DECNONIN algorithm implicates the next range value for the value record listed in the current decision record.

DECNONIN algorithm

1. \<check decision flag\> if new decision flag=false in implication record passed then go to step 4.
2. \<build decision data record\> build decision data record and put in decision array.
3. \<build range table\> call subroutine BUILDNON and put range values into decision record (subroutine BUILDNON builds a table of non-interfering range values for value record listed in the current implication record).
4. \<check decision flags\> if both new and old decision flags are false then halt.
5. \<drive value backward\> get value record and value range list from current decision record and then call subroutine DRNONBK (subroutine implicates the next value from the value range list backward).

Algorithm Function and Comments

This routine is used in conjuction with wire junction backward processing (BKWF) which pushes the range value decision onto the decision stack.

Subroutine BKWF

Data Structures

Implication stack.
Decision stack.

Algorithm Overview

BKWF processes a wired function when going backward. First, the driving sources to the wired function are found, if there is more one then a decision is pushed onto the decision stack. Next, all other segments are set up to support the driving source. Finally, the driving source is implicated backward and the the new range value on the wired function is implicated forward.

BKWF algorithm

1. \<initialize\> set failure flags to false, set current signal to signal listed in implication record.
2. \<is signal terminal point?\> if signal has one source that is a primary input or bus, then halt (no processing is required).
3. \<find driving sources\> if number of sources>1 then find number of sources that can satisfy value required on current signal.
4. \<unable to satisfy value\> if conflict or no driving sources then set failure flag to true (if decision is on wire function, i.e. a local decision, then hard failure, otherwise failure is soft).
5. \<check for satisfied value\> if value on current signal was satisfied then halt.
6. \<is there one driving source?\> if only one driving source then set current segment:=0, go to step 10.
7. \<push decision\> if current decision is not local then push new decision on decision stack, halt (the decision of which driving source to choose must be made).
8. \<build decision record\> if new decision flag in current implication record is true then allocate a decision data record and set current segment number to 0, set new decision flag to false, set old decision flag to true.
9. \<get current segment\> set current segment:=current segment in implication record.
10. \<initialize for finding driving source\> get the next segment after current segment.
11. \<check segment values\> if segment chosen has a range of values that could satisfy the goal value then set status:=try, if segment has one value that satisfies the goal than set status:=satisfied, otherwise set status:=conflict.
12. \<respond to conflict\> if status=conflict than set failure flags, halt (if local decision then hard failure, otherwise soft failure).
13. \<update implication record\> set current segment in implication record:=current segment.
14. \<initialize for non-driving segment set up\> set status:=conflict, set segment:=1 (first segment on wire junction).
15. \<check for driving source\> if segment=current segment then go to step 18.
16. \<update segment\> recalculate value on segment so that it does not interfere with value required on wired junction, set status:=conflict if not possible, set status:=try if a range of values is possible.
17. \<check status\> if status=conflict then set soft failure flag:=true, halt, if status=try then call subroutine BUILDNON to build a table of non-interfere values from range on segment, if there is more than one value in range table then put new decision on decision stack, if status=try and there is only one value then call subroutine DRNONBK (subroutine drives value backward from segment and sets failure flag).

18. <check for failure> if hard or soft failure then halt.
19. <continue processing segments> if more segments on wired junction then get next segment and go to step 11.
20. <push pin connected to driving segment onto implication stack> if the status of current segment=try then if pin segment is attached to is not on the design block then push pin onto implication stack, otherwise call subroutine BKINCONS (subroutine is an input consistancy check).
21. <update wire junction values> update ranges of segments on wire juction with respect to previous processing.
22. <implicate wire junction forward> implicate range of wire junction forward.

Algorithm Function and Comments

BKWF is called whenever going backward along a wire (whether or not it is a wired function).

Subroutine CUBEPRO

Data Structures

Implication record
IO table
Value record
Value list

Algorithm Overview

CUBEPRO processes D-cube values on gate pins by looping through the pins implicating those values obtained from BUILDTAB and DCUBEDRV.

CUBEPRO algorithm

1. <process BTR path through control pin> current gate is a BTR and decision flag in implication record=true and pin field in implication record=2 and BTR forward and backward flags both=false in implication record then push decision to choose direction onto decision stack (if processing is forward through the control line of a BTR and no choice has been made as to which direction to go then push the decision onto the decision stack).
2. <get D-cube values for gate> call subroutine BUILDTAB (subroutine builds an I/O table and value list for the current gate).
3. <check for pin status> if pin values satisfied then halt, if conflict occured and a decision point then set hard failure flag and halt, if conflict occured and not a decision point then set soft failure flag and halt.
4. <process D-cube values for gate> call subroutine DCUBEDRV (subroutine processes D-cube values for the gate).
5. <check for no matching D-cube> if no matching D-cubes found or if on path and either matching D-cubes not found for GM or matching D-cubes not found for FM then if decision point set hard failure flag:=true and halt otherwise set soft failure flag:=- true and halt.
6. <check for multiple D-cube choices> if multiple D-cube choices for either FM or GM then halt.
7. <set current machine> set machine:=FM.
8. <set back pressure flag> set back pressure flag:=- true (guarantees that gate will have its D-cubes processed forward).
9. <check for active current machine> if machine=GM and there are no GM D-cubes or if machine=FM and there are no FM D-cubes then go to step 20.
10. <set current pin> set current pin:=first pin on gate.
11. <get value record for pin> get value record for pin from gate value list, if pin specification in value list record=derived then set value derived flag:=true otherwise set it to false.
12. <check if pin value derived> if value derived flag=false then go to step 20.
13. <set path flag in value record> if current pin is an output then set path flag in current value record:- =path flag in IO table.
14. <check for value consistancy on pin> check new derived value for current pin against former value and set status accordingly (status can be conflict, try value, value satisfied).
15. <set up implication record> initialize implication record, set its value record index:=current value record, its signal number:=current signal, etc.
16. <check for conflict> if status=conflict then if at fault site and processing fault machine and current pin is an output and not on path then set soft failure flag:=true and empty implication stack and halt, if status=value satisfied and pin is an output and on path then set soft failure flag:=true and empty implication stack and halt (last condition prevents looping back on ourselves).
17. <check for try value> if status <> try then go to step 20.
18. <set path flag> if current pin=input then set path flag in implication record:=false, otherwise set path flag in implication record:=path flag in IO table and set GM and FM machine flags in implication record:=GM and FM machine flags in IO table.
19. <push implication record> if path flag in implication record=true and current machine=FM then set up value record for FM, otherwise push current implication record onto implication stack.
20. <implicate input pin through gate> if current pin=imput and processing is through gate then push implication record for pin onto implication stack and set back pressure flag:=false.
21. <get next pin> get next pin on current gate, if there is another pin then go to step 11.
22. <set machine to GM> if machine=FM then set machine:=GM and go to step 8.
23. <process TR gate> call subroutine IMPTRG (subroutine processes a TR type gate with the path coming in through its control pin, if current pin is not a control for a TR type gate then no processing takes place).

Algorithm Function and Comments

Implicates DCUBES for current gate.

Subroutine DECBTR

Data Structures

Decision record
Implication record

Algorithm Overview

DECBTR WILL SELECT A DIRECTION FOR THE BTR AS A FAULTS IS DRIVEN THRU ITS GATE INPUT. FIRST THE DIRECTION IS SET TO FORWARD. IF THIS FAILS IT IS SET TO BACKWARD. IF THAT FAILS THEN THE ATTEMPT TO DRIVE THRU THE GATE INPUT HAS FAILED

DECBTR ALGORITHM

1. <check new decision flag> if new decision flag <> true in current implication record then go to step 4.
2. <set decision flags> set new decision flag:=false and set old decision flag true in the current decision record. Set direct field:=0 (the direct field is used to determine the direction of the flow thru the BTR. A 0 means the direction is forward, a 1 means the direction is backward and >1 means both have already been tried. Put the information into the decision table using PUTDEC.
3. <attempt forward> build implication record with BTR_FORWARD set to true and BTR_BACKWARD set to false. Set NEWDEC and OLDDEC false in the implication record. Push without test onto the implication stack. DECBTR_EXIT.
4. <update float field> set float:=float+1 in current decision record, if float>1 then set hard failure flag:=true and halt.
5. <attempt backwrd setting> Build implication record with NEWDEC, OLDEC, and BTR_FORWARD false and BTR_BACKWAR true. Put the implication record into the implication stack without test and DECBTR_EXIT;

Subroutine DECFLTFW

Data Structures

Decision record
Implication record

Algorithm Overview

DECFLTFW will continue processing signal in current phase for a new decision. For an old decision, an attempt is first made to float current signal, if successful then the correct values for GM and FM are placed in the following phase and pushed onto the implication stack.

DECFLTFW algorithm

1. <check new decision flag> if new decision flag <> true in current implication record then go to step 4.
2. <set decision flags> set new decision flag:=false in current implication record, set new decision flag:=false and old decision flag:=true in current decision record. Set float field:=0 (the float field is used to determine if a float has been attempted on the signal yet, a 0 means no attempt has been made, a 1 means the attempt to float is in progress, and float >1 means the float has already been tried).
3. <check if output or implicate forward> call subroutine NOD2LOAD, if hard or soft failure then halt (subroutine controls implication forward to load and checks for design output or pseudo output).
4. <update float field> set float:=float+1 in current decision record, if float >1 then set hard failure flag:=true and halt.
5. <attempt to float on current signal> call subroutine MEMFLOAT if conflict then set hard failure flag:=-true and halt (subroutine attempts to set all driving sources to float).
6. <set up value records for next phase> set up GM and FM value records for next phase, compare to see if they can be path, if not then set hard failure flag:=-true and halt.
7. <set up implication record> set value record index:-=index to value record of previous phase, set new and old decision flags:=false.
8. <push implication record> push implication record onto implication stack.

Algorithm Function and Comments

This algorithm controls the time leap forward decisions. An attempt to float is made in the current phase and if successful the required values are driven forward in the next phase.

Subroutine DECFLTBK

Data Structures

Decision record
Implication record

Algorithm Overview

DECFLTBK will continue processing signal in current phase for a new decision. For an old decision, an attempt is first made to float current signal, if successful then the correct value is placed in the previous phase and pushed onto the impication stack.

DECFLTBK algorithm

1. <check new decision flag> if new decision flag <> true in current implication record then go to step 5.
2. <set decision flags> set new decision flag:=false in current implication record, set new decision flag:=false and old decision flag:=true in current decision record. Set float field:=0 (the float field is used to determine if a float has been attempted on the signal yet, a 0 means no attempt has been made, a 1 means the attempt to float is in progress, and float >1 means the float has already been tried).
3. <check if input> call subroutine BKINCONS, if hard or soft failure then halt (subroutine checks to see if signal is a design input or pseudo input and performs a consistancy check on it).
4. <continue processing backward on signal/segment> call subroutine BKWF, halt (subroutine processes a wire function going backwards).
5. <check old decision flag> if old decision flag <> true in current implication record then halt.
6. <update float field> set float:=float+1 in current decision record, if float >1 then set hard failure flag:=true and halt.
7. <attemp to float on current signal> call subroutine MEMFLOAT if conflict then set hard failure flag:=-true and halt (subroutine attempts to set all driving sources to float).
8. <set up value record for previous phase> set up value record, set strengths:=default strengths for current signal, set logic value:=logic value of current value record, set 0/1 strengths.
9. <set up implication record> set value record index:-=index to value record of previous phase, set new and old decision flags:=false.
10. <push implication record> push implication record onto implication stack, if conflict then set hard failure flag to true.

Algorithm Function and Comments

This algorithm controls the time leap backward decisions. An attempt to float is made in the current phase and if successful the required value is driven backward in the previous phase.

Subroutine DECRANGE

Data Structures

Decision record

Implication record

Algorithm Overview

The DECRANGE algorithm sets up good machine (GM) and fault machine (FM) value records with containing one value from the range of possible values on a given pin or signal. An implication record is then set up and pushed onto the implication stack for processing. DECRANGE processes one strength value from the range each time it is called, starting from the strongest value and working towards the weakest.

DECRANGE algorithm

1. <check new decision flag> if new decision flag:=false then go to step 7.
2. <initialize> set old decision flag:=true, set new decision flag:=false, get good machine value record for current decision.
3. <find bottom strength> find weakest allowed value in range for current signal.
4. <get fault machine value record> get fault machine value record for current decision.
5. <set lower bound in decision record> set lower bound in decision record to strongest of weakest allowed value in range for current signal or to weakest allowable driving strength for circuit, whichever is strongest, set current range value:=begining strength for GM and begining strength −1 for FM.
6. <complete decision range record> set decision range record:=begining strength and logical value for GM and FM.
7. <check decision flags> if new decision and old decision flags=false then halt.
8. <get value records> get value records for GM and FM.
9. <set current strength field for FM> if FM current strength<range lower bound then set current strength:=current strength +1, go to step 12.
10. <set current strength field for GM> if GM current strength<range lower bound then set current strength:=current strength +1, set FM current strength:=FM beginning strength, go to step 12 (this assures that all possibilities of GM and FM strengths will be tried).
11. <hard failure> set hard failure flag:=true, halt.
12. <set up GM and GM value records> set up GM and FM value records for use by implication process.
13. <set up implication record> set pin:=decision record pin, path:=true, GM:=true, FM:=true, decision:=true, forward:=true, value record:=GM value record index, in implication record.
14. <push onto implication stack> push implication record onto implication stack, if conflict then set soft failure flag.

Algorithm Function and Comments

This algorithm breaks signal strength ranges down into descrete values to be processed one at a time as a decision choice.
Subroutine DECSETUP

Data Structures

IMPLICATION STACK: The implication stack is a stack made up of the following records:
MCT or signal no.
index to value rec
flags:
  path
  forward
  decision
  good machine
  fault machine
  old decision
  new decision
pin number DECISION ARRAY: See the DECIDE algorithm for details of the decision array mechanism.
DECISION STACK: See the DECIDE algorithm for details of the decision stack mechanism.
The decision record is made up of the following records:
pin number
path flag
forward flag
decision flag
good machine flag
fault machine flag
new decision flag
old decision flag
decision type
pointer to gate (0 if record is for signal)
index to value record
pointer to parent decision
pointer to data associated with decision
highest affecting decision number
child number
choices

Algorithm Overview

The current decision is checked for a failure condition, if one exists, then a backup occurs to the last decision which affected the current decision. In the process of backing up, the implication and decision stacks are cleaned up of information pertaining to the failed decision. If the backup places the index at or before the first decision in the decision array, then the test generation failed.

If current decision did not fail, then the index to the current decision in the decision array is incremented. If the index points past the last decision in the array, then a new decision is popped off of the decision stack and placed at that location. If there are no more decisions on the decision stack when the pop is attempted, then the test generation was a success.

DECSETUP algorithm

1. <test for failure> if not a hard failure or not a decision type 11 with a soft failure, then go to step 8.
2. <find decision backup location> set backup location:=highest affecting decision number of current decision (in the case where the backup location was not a real decision with choices, continue backing up by decrementing the backup location index until a real decision is found).
3. <find parent of current decision> set parent location to the parent decision index recorded in the current decision record (in the case that the parent decision indexed is not a real decision with choices, continue following parent decision links until a real parent decision is found).
4. <insure exhaustive search> for all decision records from parent decision +1 to backup location, set the highest affecting decision number of each decision to the one immediately preceding it (this will insure that when a backup to a highest affecting decision number other than the parent occurs, all of the decisions in between in the decision array will be visited).

5. <remove decision> call subroutine CLEANUP (subroutine moves current decision to end of decision array, cleans up value records, decision table, and decision stack, purges implication stack).
6. <push current decision> remove current decision from the decision array and push it onto the decision stack (if the decision backup was to the highest affecting decision other than the parent, then this decision will have to be remade, if not it will be deleted from the stack later).
7. <update current decision> set current decision number to backup location.
8. <was there any kind of failure?> if not a failure then go to step 12.
9. <set failure flags> set hard and soft fail flags to false.
10. <get next decision> if more decisions then call subroutine CLEANUP, halt (subroutine will delete current decision from array and clean up associated data structures, current decision number will be decrimented).
11. <test generation has failed> set decision done flag to true and mark fault test generation as failed, halt.
12. <get next decision number> increment decision number.
13. <check for more decisions in array> if decision number<=number of decisions in array then halt.
14. <pop next decision from stack> pop decision from stack, if stack was empty then test generation has been successful, otherwise put popped decision into decision array, halt.
15. <increment counters> for cop frequency and fltcnt and choic to permit user control for ONOFF commands. If value freq then add link counter to cop mod count. If decisio freq then increment the cop mod count. If choice freq then cop mod count=i_dec mod freq.
16. <process analyze commands> Check fltcnt and choice to see if any new user analyze commands should be used. If so then turn diagl debug switch on or off depending on restricted conditions.
count greater than limit. Accomplished in ONOFFPRS.

Algorithm Function and Comments

The purpose of DECSETUP is to control the identification of the next decision to be processed. The actual structure of the decision tree can be modified here during a decision backup in order to assure an exhaustive search of the decision space.
Subroutine CLEANUP Data Structures decision map array
decision array
decision stack
implication stack Algorithm Overview The CLEANUP algorithm processes the decision array by putting those decisions back on the decision stack that had an affecting decision with a decision number higher than the parent decsion that was either deleted or put on the decision stack. Those decisions whose parent decisions were either deleted or put on the decision stack are deleted. The decision array and decision stack are compressed and the implication stack is emptied. All of the value records are visited and those no longer needed are deleted.

CLEANUP algorithm

1. <move decision to end of list> move decision record to end of decision array, move decision data record to end of decision data list.
2. <set up decision map array> mark first element in decision map array to delete, mark the remaining elements as not processed.
3. <set change flag> set change flag:=false.
4. <mark decisions to be placed on decision stack or to be deleted> for all but the first element in map array, if highest numbered affecting decision of corresponding decision to current map array element is marked to be deleted or moved to decision stack then mark current element decision to be moved to decision stack, if parent decision of corresponding decision to current map array element is marked to be deleted or stacked, then mark current map array decision to be deleted, if a map array element has been changed then set change flag:=true.
5. <check change flag> if change flag=true then go to step 3.
6. <process decision stacking and deletions> for every element in map array, if element is marked to be stacked then push associated decision onto stack, if element is marked to be stacked or deleted then remark it as deleted.
7. <Map the decision move> Determine the new decision number for each surviving decision based upon the deletion of lower numbered non surviving decisions and a move into the vacated slots. The decision numbers inside the value racs must be changed to the new numbers. The mapping to the new numbers is done now so that the information may be used during the value records purge and change of decision numbers which is to follow.
8. <update value records> traverse all value records, if map array element associated with value record decision number is marked as deleted or stacked then delete value record, otherwise update decision number in value record to that specified in associated map array element.
9. <compress decision data> traverse map array and for the unprocessed elements, compress their associated decision data records into consecutive positions starting with data record pointed to by the current decision record then update the map array elements to point to their associated decision numbers.
10. <update decision stack> walk down stack, check map array element for each record on the stack, if decision is marked as deleted then remove from stack and compress stack, otherwise update parent decision with that listed in map array element.
11. <update decision array> walk through decision array and update highest affecting decision number and parent decision number according to the associated entry in the map array.

Algorithm Function and Comments

The function of the CLEANUP algorithm is to do house keeping on the decision data structures and to purge unneeded value records.
Subroutine SIGPRO Data Structures Implication record

Algorithm Overview

SIGPRO branches to the applicable implication control subroutine according to the forward flag in the implication record and according to whether or not the signal number in the implication record is greater than the number of signals. A signal number greater than the number of signals means that implication is occuring on a signal segment.

SIGPRO algorithm

1. <go forward on segment> if forward flag in implication record=true and signal number in implication record>number of signals then call subroutine FWDSEG (a signal number greater than the number of signals means that a segment is currently being processed, subroutine FWDSEG processes forward implication through a wired junction for both a path and non-path).
2. <go forward on node> if forward flag in implication record=true and signal number in implication record<=number of signals then call subroutine FWDNODE (subroutine processes forward implication on a signal).
3. <go backward on segment> if forward flag in implication record=false and signal number in implication record>number of signals then call subroutine BKSEG (subroutine controls the implication backward on a segment).
4. <go backward on node> if forward flag in implication record=false and signal number in implication record<=number of signals then call subroutine BKNODE (subroutine controls the implication backward on a node).

Algorithm Function and Comments

SIGPRO controls the implication processing of signals.

Subroutine CUBEPRO

Data Structures

Implication record
IO table
Value record
Value list

Algorithm Overview

CUBEPRO processes D-cube values on gate pins by looping through the pins implicating those values obtained from BUILDTAB and DCUBEDRV.

CUBEPRO algorithm

1. <process BTR path through control pin> current gate is a BTR and decision flag in implication record=true and pin field in implication record=2 and BTR forward and backward flags both=false in implication record then push decision to choose direction onto decision stack (if processing is forward through the control line of a BTR and no choice has been made as to which direction to go then push the decision onto the decision stack).
2. <get D-cube values for gate> call subroutine BUILDTAB (subroutine builds an I/O table and value list for the current gate).
3. <check for pin status> if pin values satisfied then halt, if conflict occured and a decision point then set hard failure flag and halt, if conflict occured and not a decision point then set soft failure flag and halt.
4. <process D-cube values for gate> call subroutine DCUBEDRV (subroutine processes D-cube values for the gate).
5. <check for no matching D-cube> if no matching D-cubes found or if on path and either matching D-cubes not found for GM or matching D-cubes not found for FM then if decision point set hard failure flag:=true and halt otherwise set soft failure flag:=true and halt.
6. <check for multiple D-cube choices> if multiple D-cube choices for either FM or GM then halt.
7. <set current machine> set machine:=FM.
8. <set back pressure flag> set back pressure flag:=true (guarantees that gate will have its D-cubes processed forward).
9. <check for active current machine> if machine=GM and there are no GM D-cubes or if machine=FM and there are no FM D-cubes then go to step 20.
10. <set current pin> set current pin:=first pin on gate.
11. <get value record for pin> get value record for pin from gate value list, if pin specification in value list record=derived then set value derived flag:=true otherwise set it to false.
12. <check if pin value derived> if value derived flag=false then go to step 20.
13. <set path flag in value record> if current pin is an output then set path flag in current value record:==path flag in IO table.
14. <check for value consistancy on pin> check new derived value for current pin against former value and set status accordingly (status can be conflict, try value, value satisfied).
15. <set up implication record> initialize implication record, set its value record index:=current value record, its signal number:=current signal, etc.
16. <check for conflict> if status=conflict then if at fault site and processing fault machine and current pin is an output and not on path then set soft failure flag:=true and empty implication stack and halt, if status=value satisfied and pin is an output and on path then set soft failure flag:=true and empty implication stack and halt (last condition prevents looping back on ourselves).
17. <check for try value> if status <> try then go to step 20.
18. <set path flag> if current pin=input then set path flag in implication record:=false, otherwise set path flag in implication record:=path flag in IO table and set GM and FM machine flags in implication record:=GM and FM machine flags in IO table.
19. <push implication record> if path flag in implication record=true and current machine=FM then set up value record for FM, otherwise push current implication record onto implication stack.
20. <implicate input pin through gate> if current pin=input and processing is through gate then push implication record for pin onto implication stack and set back pressure flag:=false.
21. <get next pin> get next pin on current gate, if there is another pin then go to step 11.
22. <set machine to GM> if machine=FM then set machine:=GM and go to step 8.
23. <process TR gate> call subroutine IMPTRG (subroutine processes a TR type gate with the path coming in through its control pin, if current pin is not a

Algorithm Function and Comments

Implicates DCUBES for current gate.

Subroutine BUILDTAB

Data Structures

Implication record
I/O table
value list

Algorithm Overview

BUILDTAB puts the information from the current implication record into the I/O table. It sets up value records for the good and fault machines (GM and FM) for every pin on the gate. It then sets the pin specification fields in the value list for the gate.

BUILDTAB algorithm

1. <get gate type> get gate type and technology type from circuit description database.
2. <count inputs and outputs> get number of inputs and number of outputs on gate.
3. <put implication record information into I/O table record> put information from implication record into I/O table, put number of inputs and number of outputs in I/O table, set GM success and FM success flags:=false in I/O table, get value record indexed by implication record and put pattern and phase numbers into I/O table.
4. <get pin types> get pin types from circiut description and put in value list, set pin specified field in value list:=unspecified for each pin, assign signal number to each pin.
5. <check for BTR> if gate is not a BTR then go to step 12.
6. <implicate BTR I/O> if starting pin is the control and forward processing is in progress, then set up implication record with pin 3 and push on implication stack.
7. <set BTR pin types> set pin 1:=input, pin 2:=input, and pin 3:=output.
8. <swap pins 1 and 3> if processing backward from pin 1 then set alternate pin 1:=output, set alternate pin 3:=input, swap signal numbers on pins 1 and 3 (this enables the algorithm to use a TR D-cube regardless of which direction we are going through the BTR).
9. <set pin 1 signal number> set pin 1 signal number:= load segment number (pin 1 segment number+1).
10. <set number of I/Os> set number of ins:=2, set number of outs:=1, in IO table.
11. <reset start pin> if coming in throught control pin then set start pin:=2, else if going forward then set start pin:=1, else set start pin:=3;
12. <set up value records> for every signal in value list, get a value record for the GM and for the FM and record index in value list.
13. <check implication record GM flag> if implication record GM flag is not true then go to step 18.
14. <get first pin> set current pin to first pin in value list.
15. <update high decision numbers> for every pin call subroutine DECMARK with its associated GM value record, (suproutine DECMARK updates entries in the decision array to reflect changes in decision interdependencies).
16. <update pin specification> if value record logic value=floating 'X' then the GM specification in the value list record is 'unassigned', else if processing is forward from an output/bus or it is backward from an input/bus then the GM specification in the value list record is 'given/derive', otherwise the GM specification is 'given'.
17. <get next pin> get next pin from value list, if more then go to step 14.
18. <check implication record FM flag> if implication record FM flag is not true then halt.
19. <get first pin> set current pin to first pin in value list.
20. <update high decision numbers> for every pin call subroutine DECMARK with its associated FM value record, (suproutine DECMARK updates entries in the decision array to reflect changes in decision interdependencies).
21. <update pin specifications> if value record logic value=floating 'X' or processing is at the fault site with an output from gate then the FM specification in the value list record is 'unassigned', else if processing is forward from an output/bus or it is backward from an input/bus then the FM specification in the value list record is 'given/derive', otherwise the FM specification is 'given'.
22. <fault implication pin specifications° if current decision number=1 and value record (FM) decision number=0 and if processing is forward from output/bus or backward from input/bus then set value list pin specification:='unassigned' (this is special handling for fault implication).
23. <get next pin> get next pin from value list, if more then go to step 20.

Algorithm Function and Comments

BUILDTAB sets up the I/O table and pin value list for the current gate.

Subroutine STRENGTH

Data Structures

Value records
pin value record list
I/O table

Algorithm Overview

STRENGTH traverses the pin value list and assigns strengths to the value records associated with each pin.

STRENGTH algorithm

1. <get number of pins> get number of pins from I/O table.
2. <set machine type> set machine:=GM (good machine).
3. <get pin value record> get first pin value record.
4. <check pin value record> if GM values in GM pin value record are derived and machine=GM or FM values in FM pin value record are derived and machine=FM then continue on to next step, otherwise go to step 7.
5. <get value record index> if machine=GM then get index to GM value record from pin value record, if machine=FM then get index to FM value record from pin value record.
6. <get strengths for value record> set strengths in value record according to technology type and the state of the signals surrounding current value record.

7. <get pin value record> get next pin value record, if more then go to step 4.
8. <set machine> if machine=GM and then set machine:=FM and go to step 3.

Subroutine GETFAULT

Data Structures

VALUE RECORD:
  phase
  decision number
  signal number
FREE CHAIN: The free chain is used for memory management. As value records are discarded, they are linked together into a stack of unused (free) value records, thus memory is reused without fragmentation or the necessity of gargabe collection.
IMPLICATION STACK: each record on the stack contains the following:
  MCT or signal no.
  index to value rec
  flags:
    good machine
    fault machine
    decision
DECISION STACK: See the DECIDE algorithm for details of the decision stack mechanism. The decision stack record specifies the decision type associated with it.

Algorithm Overview

GETFAULT first removes all unneeded value records and initializes both the implication and decision stacks. It then gets the next fault to be processed from the fault list data structure. Value records are built for the good and fault machines for each phase along with an implication record which is pushed onto the implication stack. Fault selection is pushed on the decision stack as the first decision, phase selection is pushed on the decision stack as the second decision.

GETFAULT algorithm

1. <get next fault> get next fault from linked list.
2. <clean up value records> if not initial fault then walk through all of the value records putting all those that have a decision number>0, a nil backward pointer, or are for a fault machine on the free chain (only those records containing phase and strobe information will be saved).
3. <clean up stacks> initialize both the implication and decision stacks to 0 entries.
4. <delete alternate signal record> delete load signal segment alternate signal record if it exists (one extra alternate signal record is set up if the fault site is a signal output segment), restore the signal information in the associated MST.
5. <find next fault> continue down fault list until the next fault with correct status and run number is found.
5A. <find AC FINISH start point> for COP to be called later. COP is called to direct path toward the AC Finish pts.
6. <set decision number> decision number:=1 (fault always starts at decision 1).
7. <copy good machine to fault machine> duplicate any existing value records for fault machine (values present for a signal will have been set by PHASE command).
8. <is fault on signal?> if pin number=0 then fault site:=signal number, go to 11 (if pin number is >0 then the fault is on a pin rather than on a signal).
9. <does signal have multiple loads?> if signal is not a block input or number of loads=1 or signal number<=number of signals then fault site:=signal number, go to 11 (if the fault is on one of the loads of a multiple load signal then set up an alternate signal record).
10. <set up alternate signal record> record alternate signal in MST, record alternate signal in signal linked list, set fault site:=alternate signal.
11. <initialize phase number> set phase number:=1.
12. <create GM and FM value records> if alternate signal get copy of its parent signal (momsig) value record for GM else use fault site signal, get copy of fault site signal value record for FM (value records are for current phase number).
13. <set up value record values> GM, FM value records:=decision number 1, FM logic value:=stuck-at value, FM strength:=1-99.
14. <filter FM value record> get strengths for default technology and filter FM value record with them (filtering updates the strength range to reflect technology strength limits).
15. <update value record list> put GM and FM value records into list.
16. <push FM> push FM onto implication stack.
17. <increment phase number> if phase number<number of phases, then increment and go to step 12.
18. <push fault decision> put fault decision on decision stack.
19. <push phase selection decision> put phase selection decision on decision stack.

Algorithm Analysis

The purpose of GETFAULT is to get the next fault to be processed and prepare for test generation of that fault. A fault that resides on the load of a signal that has multiple load must have a signal record set up for it (alternate signal) since the fault cannot be applied to the signal and adequately model the fault specified. In order to prepare for the new fault, the decision stack and implication stack must be empty and all value records not associated with phase template and strobe information must be deleted.

What does GETFAULT cost in running time and memory? Step 1 takes O(1) time since a pointer is always kept to the last fault in the linked list. Step 2 can be expensive in that even thought it runs in O(n) time where n is the number of existing value records. The number of value records can be quite high since value records could be created for each signal and segment, for each phase, for each decision. Because step 2 is only executed once per GETFAULT call, the cost of step 2 is not important in relation to other expensive parts in CAP. All other steps take constant time including those that deal with alternate signal records. Steps 12-17 are a loop which is executed once for every phase. The cost of GETFAULT then is O(n), where n is the number of existing value records. GETFAULT costs a constant amount of space in value records, implication records, decision records, and general book keeping.

(* STEP 5A *) (* If AC fault get pointer for finish pts *) If AC & gate-pin fault & I/O transition assure signal fault
  assume memory node, find transition from memory to driven for AC test
verify that this is a memory node.
beginning at phase boundary find transition pt
find first floating or open value that float can be assigned.
allow any driven phase below AC_PHASE_TRAN if fails on AC_PHASE_TRAN phase except for phase 1.

Subroutine DECPHASE

Data Structures

Decision record
Implication record

Algorithm Overview

The DECPHASE algorithm sets up good machine value records for forward and backward implication from the current fault site for the current phase being processed in the current decision.

DECPHASE algorithm

1. <get decision information> get phase number, signal number, pin number from current decision.
2. <decrement phase number> decrement phase number in current decision record. Decrement phase number until phase can start in the selected phase.
3. <check phase number> if phase number<=0 then set hard failure flag:=true, go to step 11 (note that phase number is now one more than phase number in current decision record).
4. <build a good machine value record> build good machine value record with open strength (1-99) for 0 and 1 values, decision number:=current decision number, control path flag:=true, logic value:=opposite of fault machine value, set fault machine path flag:=true.
5. <filter GM value record> filter range values of good machine according to technology type for current signal.
6. <push GM onto implication stack> set up implication record for GM and push onto implication stack if a value record does not already exist that either conflicts or is equivalent (not an event) to the GM value record.
7. <implicate> if implication record was pushed then call subroutine IMPLICAT (subroutine implicates next record on implication stack).
8. <set failure flag> If IMPLICAT returned a soft failure and the phase number<=1 then set hard failure flag:=true, halt.
9. <check flags> if either hard or soft failure flags=-true then halt.
10. <implicate GM forward path> build implication record for GM path forward, push onto implication stack, call subroutine IMPLICAT.
11. <check failure flag> if soft failure and phase<=1 then set hard failure flag:=true.

Algorithm Function and Comments

The next phase is processed (starting from the highest phase number) and the phase number listed in the current decision record being processed is decremented. A failure from the first phase produces a hard failure for the decision.

If AC test see if need to drive back opposite value in floating state.

The invention can be practiced other than is specifically designed in this specification. For example, different types of integrated circuits including field effect transistor such as micro processors, communication links, and random logic can be tested with this invention. Such integrated circuits can include serial register latches and parallel register latches that are disclosed in the referenced patent. The disclosures and claimed invention herein provide tools that can be used in many different integrated circuits for insuring testablity of integrated circuits.

We claim:

1. A process of generating patterns of test signals that test stuck-at faults in semiconductor integrated circuits, said integrated circuits including field effect transistors, some of which have different electrical characteristics, said test signals being applied to said semiconductor integrated circuits, said integrated circuits including plural primary inputs and plural primary outputs and having plural internal nodes indirectly energizable from said primary inputs and indirectly readable from said primary outputs, said process comprising the steps of:
   (a) defining a relative strength of the electrical characteristics of said nodes at binary logic values with a set of discrete value-strength numbers;
   (b) selecting a said node of said integrated circuit;
   (c) assigning a value-strength number representing a desired stuck-at fault to said selected node;
   (d) attempting to sensitize said assigned value-strength number to a pattern of input signals to be applied to said primary inputs, said sensitizing including sensitizing value-strength numbers from said selected node to said primary inputs;
   (e) attempting to propagate said assigned value-strength number to a pattern of output signals to be read from said primary outputs, said propagating including propagating value-strength numbers from said selected node to said primary outputs;
   (f) indicating whether said attempting to sensitize and attempting to propagate successfully located a test pattern of logical states at said primary inputs and outputs to indicate said value-strength number at said selected node; and
   (g) repeating said steps (a) through (f) for every node of said integrated circuit.

2. A process of generating patterns of test signals that produce a logical state transition at a start node of a test path and that reflect the capture state transition at an end node of the test path; said process comprising the steps of:
   (a) propagating said logical state transition from said start node to said end node through said test path;
   (b) sensitizing one logical state from said start node to primary inputs associated with said test path; and
   (c) sensitizing another logical state from said start node to said primary inputs on a clock cycle prior to said one logical state occurring at a said start node;
   (d) wherein said propagating and sensitizing includes defining relative strengths of the electrical characteristics of the nodes at binary logic values with a set of discrete value-strength numbers.

3. The process of claim 2 in which said propagating includes propagating said transition to capture said transition within a selected clock period.

4. The process of claim 2 including propagating said transition from said end node to an observable point.

* * * * *